(12) United States Patent  
Liaw (10) Patent No.: US 8,304,514 B2  
(45) Date of Patent: Nov. 6, 2012

(54) CONJUGATED POLYMER, METHOD FOR PREPARING THE SAME, AND OPTOELECTRONIC DEVICE EMPLOYING THE SAME

(75) Inventor: Der-Jang Liaw, Taipei (TW)

(73) Assignee: National Taiwan University of Science & Technology, Taipei (TW)

( * ) Notice: Subject to any disclaimer, the term of this patent is extended or adjusted under 35 U.S.C. 154(b) by 21 days.

(21) Appl. No.: 13/014,053

(22) Filed: Jan. 26, 2011

(65) Prior Publication Data

US 2012/0017994 A1    Jan. 26, 2012

(30) Foreign Application Priority Data

Jul. 21, 2010    (TW) ................................ 99123931 A (51) Int. Cl.
*C08G 73/00*    (2006.01)
(52) U.S. Cl. ...................... 528/422; 528/342.8; 567/157; 564/306; 564/326; 136/263; 430/71; 257/40; 257/E51.024
(58) Field of Classification Search .................. 528/422, 528/342, 8; 567/157; 564/306, 326; 136/263; 430/71; 257/40, E51.024
See application file for complete search history.

(56) References Cited

PUBLICATIONS

Chen et al. (J. of Poly. Chem. Part A: Poly. Chem., 48, 4654-4667, 2010).*
Lai et al. (Macromolecules, 43, 5, 2236-2243, 2010).*

* cited by examiner

*Primary Examiner* — Shane Fang
(74) *Attorney, Agent, or Firm* — Muncy, Geissler, Olds & Lowe, PLLC (57) ABSTRACT

The invention provides a conjugated polymer, a method for preparing the same, and optoelectronic devices employing the same. The conjugated polymer includes a structure represented by Formula (I), Formula (I)

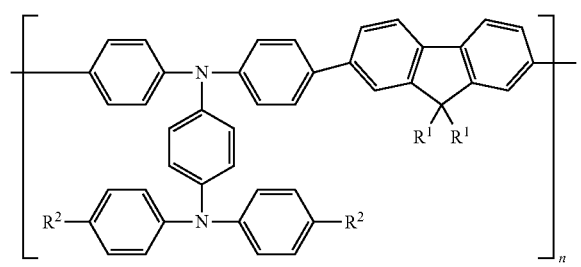

wherein, $R^1$ is independently an octyl or dodecyl group, $R^2$ is independently an H or 1,1,3,3-tetramethylbutyl, and, n is an integer larger than 1.

10 Claims, 7 Drawing Sheets

CONJUGATED POLYMER, METHOD FOR PREPARING THE SAME, AND OPTOELECTRONIC DEVICE EMPLOYING THE SAME

CROSS REFERENCE TO RELATED APPLICATIONS

This application is based upon and claims the benefit of priority from the prior Taiwan Patent Application No. 099123931, filed on Jul. 21, 2010, the entire contents of which are incorporated herein by reference.

BACKGROUND OF THE INVENTION

1. Field of the Invention

The invention relates to a conjugated polymer, methods for preparing the same, and optoelectronic devices employing the same and, more particularly, to an electrochromic conjugated polymer, methods for preparing the same, and optoelectronic devices employing the same.

2. Description of the Related Art

Electrochromism is known as reversible electromagnetic absorbance/transmittance and color change resulting from the oxidation or the reduction of material in response to an externally applied potential by electrochemical means. Due to electrochromism, many technological applications such as automatic anti-glazing mirrors, smart windows, electrochromic displays, and chameleon materials, have been developed. Thus, a wide variety of electrochromic materials showing high coloration efficiencies, low operating voltages, and fast switching capabilities have been developed, which can be classified into several distinct categories such as metal oxides [tungsten trioxide ($WO_3$) or iridium dioxide ($IrO_2$)], mixed-valence metal complexes (prussian blue), small organic molecules (viologens, bipyridinium, and phthalocyanines), and conjugated polymers.

Conjugated organic polymers have received significant attention throughout the course of the past two decades, stemming not only from their high conductivities in the doped state but also from a variety of optoelectronic and redox properties for advanced technological applications such as light-emitting diodes, photovoltaic cells, and electrochromic cells. Moreover, the most important features of conjugated polymers are the ability to fine-tune color through chemical structure modification of the conjugated backbone and produce multi-chromism from same materials.

Accordingly, the disclosure provides a novel conjugated polymer, with improved optoelectronic properties, solubility, and stability, which can be applied in various fields, such as the OLED/PLED (organic light emitting device/polymer light emitting device), solar cell, photoreceptor, emitter, EL (electroluminescent) device, or electrochromic material fields.

BRIEF SUMMARY OF THE INVENTION

An exemplary embodiment of the conjugated polymer includes a structure represented by Formula (I)

Formula (I)

wherein, $R^1$ is independently an octyl or dodecyl group, $R^2$ is independently an H or 1,1,3,3-tetramethylbutyl, and n is an integer larger than 1. For example, the aforementioned conjugated polymer can have a structure represented by the following:

wherein, n is an integer larger than 1.

In another exemplary embodiment of the disclosure, the invention provides a method for preparing the aforementioned conjugated polymer, which includes reacting a monomer having a structure represented by with a compound having a structure represented by:

in the presence of tetrakis(triphenylphosphine)palladium as a catalyst.

Yet another exemplary embodiment of the invention provides an optoelectronic device, including a substrate, and a film formed on the substrate. Particularly, the film includes the aforementioned conjugated polymer. According to embodiments of the disclosure, the optoelectronic device can be an organic light emitting diode (OLED), a polymer light emitting diode (PLED), a solar cell, a photoreceptor, a smart window, or an electrochromic device.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Conjugated Polymer

The disclosure provides a conjugated polymer having a structure represented by Formula (I):

Formula (I)

wherein, $R^1$ is independently an octyl or dodecyl group;

$R^2$ is independently an H or 1,1,3,3-tetramethylbutyl; and n is an integer larger than 1.

The conjugated polymer has a repeat unit constructed by a triphenylamine moiety and a fluorene moiety. Due to the introduction of the triphenylamine moiety, the conjugated polymer exhibits improved solubility, and thermal-resistance. Further, since the central nitrogen atom of the triphenylamine moiety has redox activities, the conjugated polymer exhibits excellent hole-transporting properties. Also, due to the introduction of the fluorene moiety, the conjugated polymer exhibits improved optoelectronic properties and electron-donating properties. The conjugated polymer of the disclosure is suitable for being used in an optoelectronic device such as an organic light emitting diode (OLED), a polymer light emitting diode (PLED), a solar cell, a photoreceptor, a smart window, or an electrochromic device.

The conjugated polymer according to Formula (I) of the invention includes the following compounds shown in Table 1.

TABLE 1

| Example | Structure |
|---|---|
| 1 | 
conjugated polymer (1) |
| 2 | 
conjugated polymer (2) |
| 3 | 
conjugated polymer (3) |
| 4 | 
conjugated polymer (4) |

Preparation of Conjugated Polymer

The conjugated polymer of the disclosure can be prepared from a synthesized dibromo compound with a diboronic compound via Suzuki coupling reaction.

For example, the conjugated polymer of the disclosure can be prepared by reacting a monomer having a structure represented by Formula (II):

Formula (II)

with a compound having a structure represented by Formula (III):

Formula (III)

in the presence of tetrakis(triphenylphosphine)palladium as a catalyst.

In order to clearly illustrate the method for preparing organic compounds according to Formula (I), the preparation of compounds disclosed in Examples 1, and 2 are described in detail as below.

Example 1

Preparation of Conjugated Polymer (1)

First, 27.2 mmol of 1-bromo-4-iodobenzene, 13.6 mmol of 4-Amino triphenylamine, 0.27 mmol of bis(dibenzylideneacetone)palladium ([Pd(dba)$_2$]), 0.54 mmol of 1,1'-bis(diphenylphosphino)ferrocene (DPPF), 40.8 mmol of sodium tert-butoxide and 18 ml toluene were added into a 250 ml bottle. After heating to reflux under a nitrogen atmosphere for 6 hrs, the solvent was removed under reduced pressure, and the residue was extracted with dichloromethane/water. The collected organic layer was dried by MgSO$_4$ overnight and then filtered to remove MgSO$_4$. After removing the solvent of filtrate, the residue was purified by silica gel column chromatography (dichloromethane:n-hexane=1:3) and recrystallized from hexane to obtain N,N-bis(4-bromophenyl)-N',N'-dipheny-1,4-phenylenediamine (DTPADBR) as white crystals (61% yield).

The synthesis pathway was as follows:

N,N-bis(4-bromophenyl)-N',N'-dipheny-1,4-phenylenediamine (DTPADBR) had a melt point of 166° C.

The $^1$H NMR and $^{13}$C NMR data of DTPADBR is shown below:

$^1$H NMR. (CDCl$_3$): δ(ppm)=7.35 (d, 4H), 7.27 (t, 4H), 7.12 (d, 4H), 7.04~7.00 (m, 4H), 6.97~6.94 (m, 6H).

$^{13}$C NMR (CDCl$_3$): δ(ppm)=147.63, 146.54, 143.94, 141.38, 132.27, 129.25, 125.87, 124.98, 124.92, 124.06, 122.77, 115.05.

The FT-IR spectrum was recorded in the range of 4000-400 cm$^{-1}$ on a Bio-Rad FTS-3500 spectrometer and is shown below:

FTIR (KBr, v/cm$^{-1}$): 3035 (Ar—H stretch), 1484 (C=C), 1269 (Ar—N) and 1002 (Ar—Br) cm$^{-1}$.

Next, 0.45 mmol of N,N-bis(4-bromophenyl)-N',N'-dipheny-1,4-phenylenediamine (DTPADBR), 0.45 mmol of 9,9-dioctylfluorene-2,7-diboronic acid bis(1,3-propanediol) ester, 10 ml of K$_2$CO$_3$ (aq) (3M), and 10 ml of toluene were added into a bottle. After stirring, 1.34×10$^{-2}$ mmol of tetrakis(triphenylphosphine)palladium (Pd(PPh$_3$)$_4$) was added into the bottle and heated to reflux at 105° C. for 48 hrs.

The reaction mixture was cooled, dissolved in toluene, and then poured into 1 L of methanol for several times. The yellow precipitate was collected by filtration, washed by water, and dried under vacuum. After drying at 150° C. for 24 hrs, the conjugated polymer (1) was obtained with a yield of 81%. The synthesis pathway was as follows:

conjugated polymer (1)

The conjugated polymer (1) had a 10% weight loss decomposition temperature ($T_{d10}$) of 446° C. (under a nitrogen atmosphere) or of 432° C. (under air), and a glass transition temperature of 141° C.

The $^1$H NMR and $^{13}$C NMR data of the conjugated polymer (1) is shown below:

$^1$H NMR. (CDCl$_3$): δ(ppm)=7.78 (d, 2H), 7.65~7.60 (m, 8H), 7.32~7.27 (t, 8H), 7.18~7.14 (t, 6H) 7.08 (d, 2H), 7.04 (t, 2H), 2.07 (s, 4H), 1.23~1.09 (m, 20H), 0.83 (t, 6H), 0.77 (s, 4H).

$^{13}$C NMR (CDCl$_3$): δ(ppm)=151.65, 147.84, 146.88, 143.35, 142.42, 139.76, 139.35, 135.61, 129.22, 127.82, 125.89, 125.51, 125.44, 123.84, 123.79, 122.53, 120.91, 119.91, 55.22, 40.51, 31.78, 30.05, 29.22, 29.21, 23.82, 22.59, 14.06.

The FT-IR spectrum of the conjugated polymer (1) was recorded in the range of 4000-400 cm$^{-1}$ on a Bio-Rad FTS-3500 spectrometer and is shown below:

FTIR (KBr, v/cm$^{-1}$): 3034 (Ar—H), 2924 and 2854 (C—H), 1501 (C═C) and 1272 (Ar—N) cm$^{-1}$.

Example 2

Preparation of Conjugated Polymer (2)

First, 76.20 mmol of Bis-(4-(2,4,4-trimethylpentan-2-yl)phenyl)amine, 91.45 mmol of 4-Fluoronitrobenzene, 114.31 mmol of sodium hydride, 2.74 g of NaH, and 120 ml of dimethyl sulfoxide (DMSO) were added into a bottle. After stirring at 120° C. for 48 hrs, the reaction mixture was cooled and then poured into 1 L of methanol. The yellow precipitate was collected by filtration and dried under vacuum. The product was purified by silica gel column chromatography (dichloromethane:n-hexane=1:3) and recrystallized from ethyl acetate to afford 4-nitro-N,N-bis(4-(2,4,4-trimethyl-pentan-2-yl)phenyl)aniline as a yellow crystal with a yield of 60%. The 4-nitro-N,N-bis(4-(2,4,4-trimethylpentan-2-yl)phenyl)aniline had a melt point of 167° C. The synthesis pathway was as follows:

Next, 13.60 mmol of 4-nitro-N,N-bis(4-(2,4,4-trimethyl-pentan-2-yl)phenyl)aniline, 0.22 of 10% Pd/C, and 150 ml of ethanol were added into a bottle. Next, the mixture was heated to reflux, and 7 ml of hydrazine monohydrate was added slowly to the mixture from a dropping funnel over a period of 1 hrs under dry nitrogen. After a further 12 hrs of reflux, the mixture solution was filtered to remove Pd/C, and the filtrate was cooled to precipitate. The crude product was collected by filtration and recrystallization from ethanol to afford 4-Amino-N,N-bis(4-(2,4,4-trimethylpentan-2-yl)phenyl)aniline as a white crystal with a yield of 80%. The 4-amino-N,N-bis(4-(2,4,4-trimethylpentan-2-yl)phenyl)aniline had a melt point of 95° C.

The synthesis pathway was as follows:

Next, 2.06 mmol of 4-Amino-N,N-bis(4-(2,4,4-trimethylpentan-2-yl)phenyl)aniline, 4.13 mmol of 1-bromo-4-iodobenzene(1-Bromo-4-iodobenzene), $4.13\times10^{-2}$ mmol of bis(dibenzylideneacetone)palladium ([Pd(dba)$_2$]), $8.25\times10^{-2}$ mmol of 1,10-bis(diphenylphosphino)ferrocene (DPPF), 6.19 mmol of sodium tert-butoxide, and 6 ml of toluene were added into a bottle. After stirring for 6 hrs, the solvent was removed under reduced pressure, and the residue was extracted with dichloromethane/water. The collected organic layer was dried over MgSO$_4$ overnight and then filtered to remove MgSO$_4$. After removing the solvent of filtrate, the residue was purified by silica gel column chromatography (dichloromethane:n-hexane=1:3) and recrystallized from hexane to obtain N,N-Bis(4-bromophenyl)-N',N'-bis(4-(2,4,4-trimethylpentan-2-yl)phenyl)-1,4-phenylenediamine as a white crystal with a yield of 61%. The N,N-Bis(4-bromophenyl)-N',N'-bis(4-(2,4,4-trimethylpentan-2-yl)phenyl)-1,4-phenylenediamine had a melt point of 205° C.

The synthesis pathway was as follows:

Next, 0.3146 mmol of N,N-Bis(4-bromophenyl)-N',N'-bis(4-(2,4,4-trimethylpentan-2-yl)phenyl)-1,4-phenylenediamine, and 0.3146 mmol of 9,9-dioctylfluorene-2,7-diboronic acid bis(1,3-propanediol) ester were added into a bottle. After, $9.4369\times10^{-3}$ mmol of tetrakis(triphenylphosphine)palladium (Pd(PPh$_3$)$_4$), 5 ml of toluene), and 5 ml of K$_2$CO$_3$ (aq) (3M) were then added into the bottle, and the mixture was heated to reflux at 105° C. for 48 hrs for performing a Suzuki Coupling.

After completing the reaction, the reaction mixture was cooled to room temperature, and the organic layer was separated, washed with water, and precipitated into methanol. The light yellow-green fibrous polymer sample was filtered, washed with excess methanol, dried, and purified by a Soxhlet extraction with acetone for 2 days, obtaining the conjugated polymer (2) with a yield of 92%. The synthesis pathway was as follows:

conjugated polymer (2)

The conjugated polymer (2) had a 10% weight loss decomposition temperature ($T_{d10}$) of 445° C. (under a nitrogen atmosphere) or of 412° C. (under air), and a glass transition temperature of 144° C.

UV-Vis Spectrum & PL Spectrum

Figure 1:
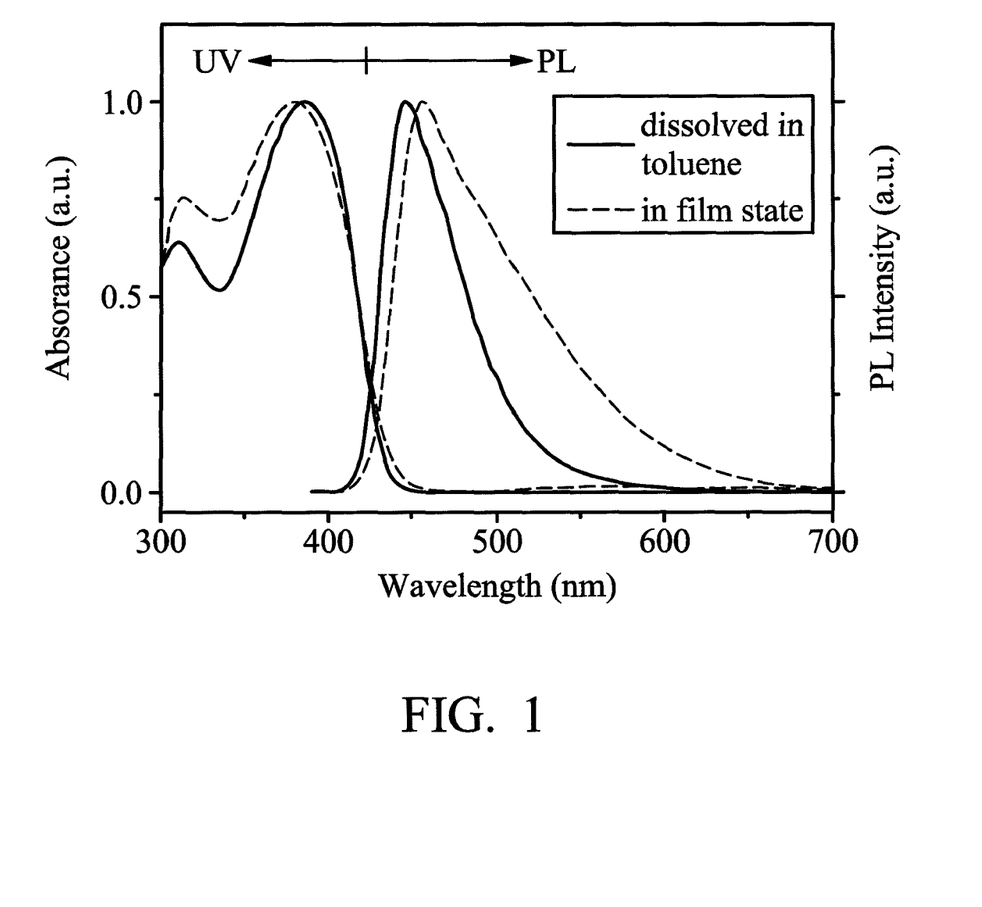
FIG. 1 shows the UV spectra and the PL spectra of the conjugated polymer (1) prepared by Example 1, dissolved in toluene, and in a film state, respectively.

The conjugated polymer (1) of Example 1 was dissolved in toluene to prepare a solvent ($1\times10^{-5}$ M solution), and the optical properties of the solvent were investigated by UV-vis and photoluminescence spectroscopy. The UV-vis absorption of the solvent of conjugated polymer (1) exhibited a strong absorption around 385 nm and a minor absorption around 310 nm in toluene solution. The PL (photoluminescence) emission peak of the solvent was observed at 445 nm. Further, a solid film was made by the conjugated polymer (1) of Example 1, and the optical properties of the solid film were investigated by UV-vis and photoluminescence spectroscopy. The UV-vis absorption of the solid film of conjugated polymer (1) exhibited a strong absorption around 378 nm and a minor absorption around 314 nm in toluene solution. The PL (photoluminescence) emission peak of the solid film was observed at 454 nm. The above results are shown in FIG. 1.

Figure 2:
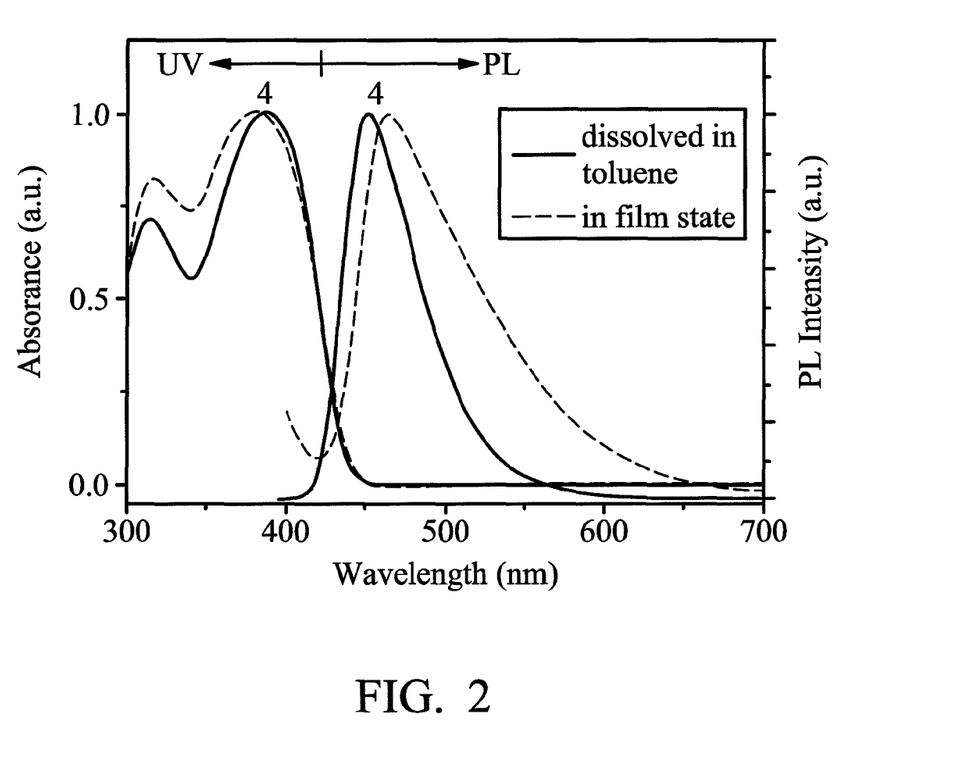
FIG. 2 shows the UV spectra and the PL spectra of the conjugated polymer (2) prepared by Example 2, dissolved in toluene, and in a film state, respectively.

Further, the conjugated polymer (2) of Example 2 was dissolved in toluene to prepare a solvent ($1\times10^{-5}$ M solution), and the optical properties of the solvent were investigated by UV-vis and photoluminescence spectroscopy. The UV-vis absorption of the solvent of conjugated polymer (2) exhibited a strong absorption around 387 nm and a minor absorption around 314 nm in toluene solution. The PL (photoluminescence) emission peak of the solvent was observed at 452 nm. Further, a solid film was made by the conjugated polymer (2) of Example 2, and the optical properties of the solid film were investigated by UV-vis and photoluminescence spectroscopy. The UV-vis absorption of the solid film of conjugated polymer (2) exhibited a strong absorption around 381 nm and a minor absorption around 318 nm in toluene solution. The PL (photoluminescence) emission peak of the solid film was observed at 462 nm. The above results are shown in FIG. 2.

HOMO and LUMO Energy Gaps

The HOMO (highest occupied molecular orbital) and LUMO (lowest unoccupied molecular orbital) energy gaps of the conjugated polymers (1) and (2) were determined by cyclic voltammetry (CV) with the following steps. The conjugated polymers (1) and (2) were dissolved in toluene, respectively ($1\times10^{-5}$M). The oxidation potential versus Ag/Ag$^+$ was calculated from a CV spectrum using ferrocene as the internal standard. HOMO and LUMO energy gaps were calculated from the following equation:

LUMO=HOMO+band gap

Table 2 shows the HOMO and LUMO energy gaps of the conjugated polymers (1) and (2).

TABLE 2

|  | HOMO(eV) | LUMO(eV) |
|---|---|---|
| conjugated polymer (1) | −5.03 | −2.19 |
| conjugated polymer (2) | −4.95 | −2.13 |

Electrochromic Characteristics

Figure 3:
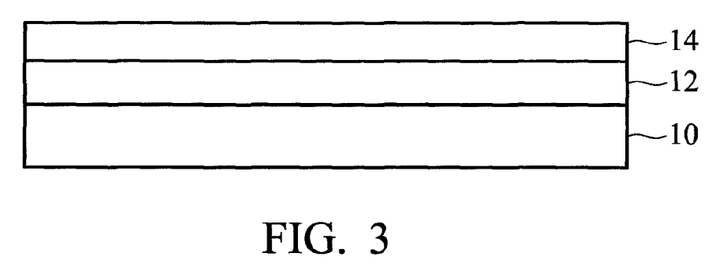
FIG. 3 shows an optoelectronic device including a glass substrate, an ITO electrode, and a conjugated polymer film.

FIG. 3 shows an optoelectronic device including a glass substrate 10. An indium-tin oxide (ITO) electrode 12 was formed on the substrate 10. A film 14 was formed on the electrode 12, wherein the film 14 was prepared from the conjugated polymer (1) or the conjugated polymer (2). Next, a voltage was applied to the above device, and the UV-vis and Near-IR spectra of the film 14 were measured.

Figure 4:
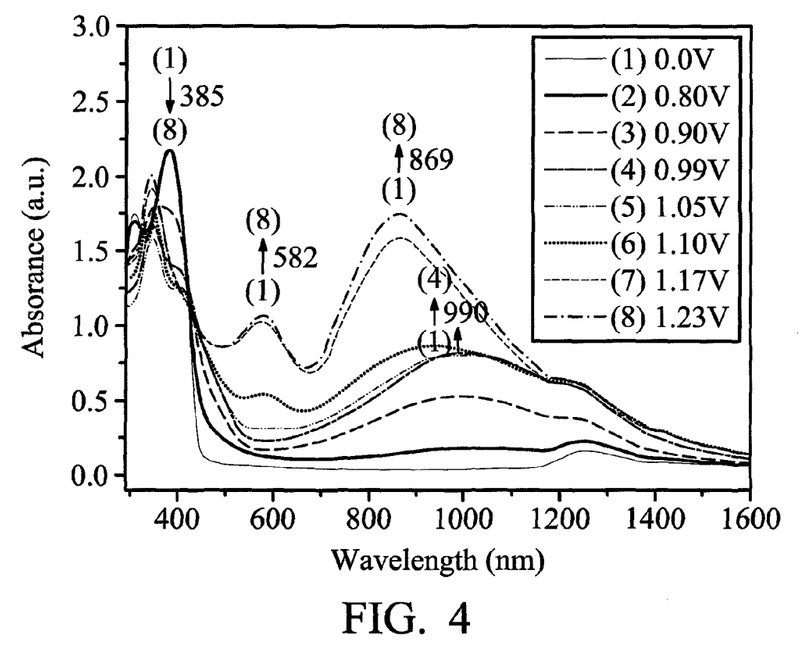
FIG. 4 shows a graph plotting wavelength against absorbance of the optoelectronic device employing the conjugated polymer (1) under various applied voltages.

Regarding the device employing the conjugated polymer (1), when the voltage was increased from 0 to 0.99 V (first oxidation state), the intensity of the absorption peak at 385 nm gradually decreased, and a new peak at around 990 nm gradually increased in intensity. As the applied voltage became more anodic to 1.23 V (second oxidation state), two new peaks at 623 and 886 nm gradually increased in intensity, as shown in FIG. 4.

Further, the device employing the conjugated polymer (1) exhibited a pale yellow emission at a transmissive neutral state (0V). At a high absorbing semi-oxidized state (first oxidation state) (0.99V), the device employing the conjugated polymer (1) exhibited a green emission. At a fully oxidized state (second oxidation state) (1.23V), the device employing the conjugated polymer (1) exhibited a blue emission.

Moreover, the device employing the conjugated polymer (1) was potential stepped between its neutral state (0 V) and the second oxidation state (1.23 V) state with a cycle time of 80 s. The results are shown in FIG. 5.

Figure 5:
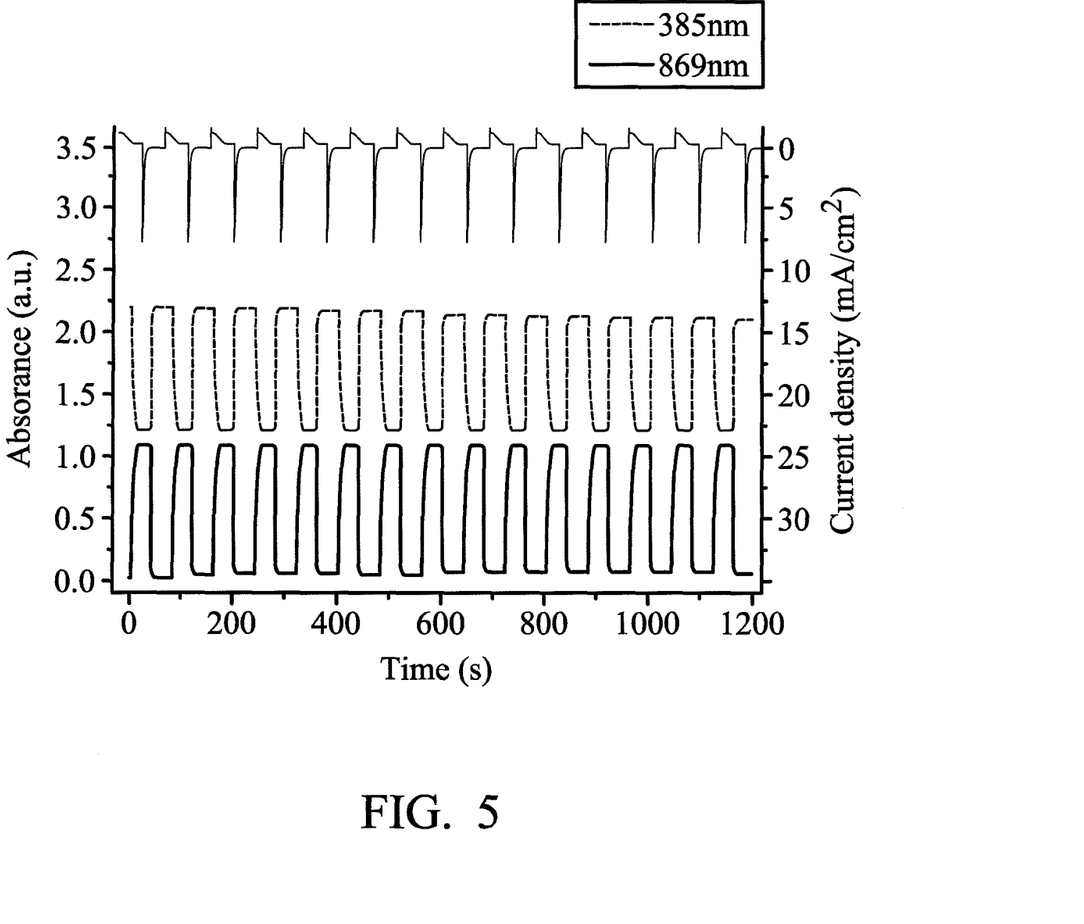
FIG. 5 shows a potential step absorptometry of the optoelectronic device employing the conjugated polymer (1) during a continuous cycling test by switching potentials between 0 V and 1.23 V.

As shown in FIG. 5, the device employing the conjugated polymer (1) had a maximum absorption wavelength of 869 nm, an electrochromic switching time for oxidation of 11.8 s, and an electrochromic switching time for bleaching of 3.4 s.

Figure 6:
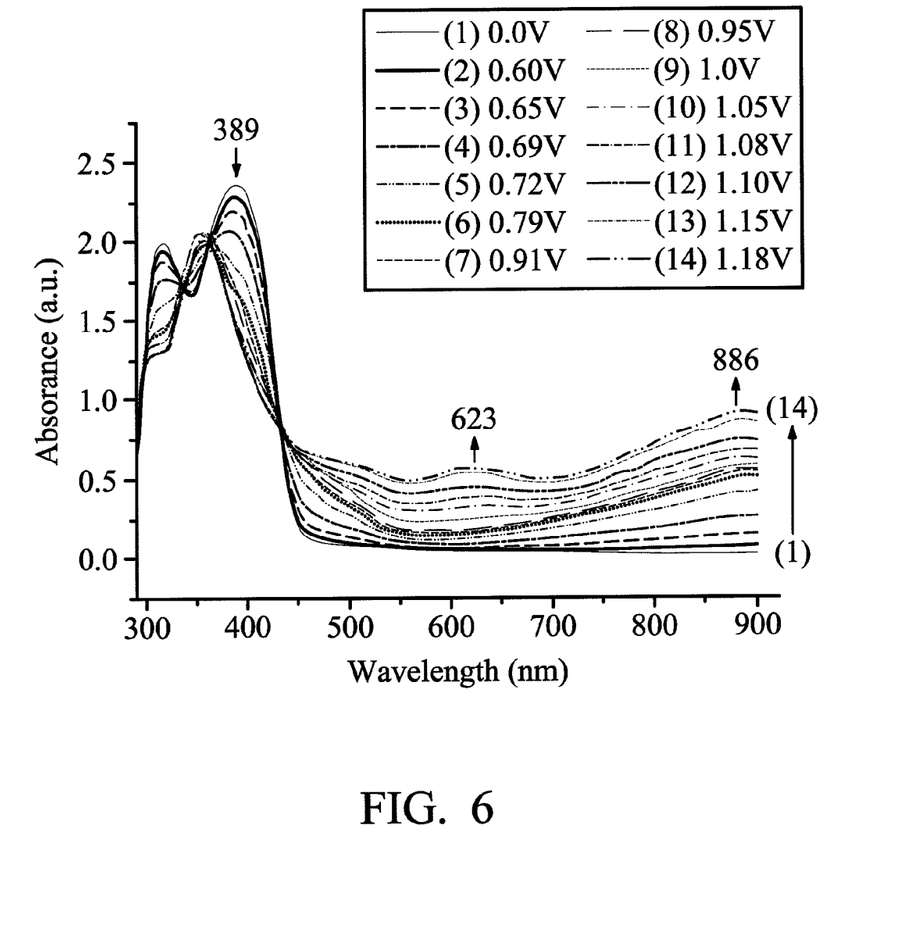
FIG. 6 shows a graph plotting wavelength against absorbance of the optoelectronic device employing the conjugated polymer (2) under various applied voltages.

Regarding the device employing the conjugated polymer (2), when the voltage was increased from 0 to 0.95 V (first oxidation state), the intensity of the absorption peak at 316-385 nm gradually decreased, and a new peak at around 700-900 nm gradually increased in intensity. As the applied voltage became more anodic to 1.18 V (second oxidation state), two new peaks at 623 and 886 nm gradually increased in intensity, as shown in FIG. 6.

Further, the device employing the conjugated polymer (2) exhibited a pale yellow emission at a transmissive neutral state (0 V). At a high absorbing semioxidized state (first oxidation state) (0.99 V), the device employing the conjugated polymer (2) exhibited a green emission. At a fully oxidized state (second oxidation state) (1.18 V), the device employing the conjugated polymer (2) exhibited a blue emission.

Figure 7:
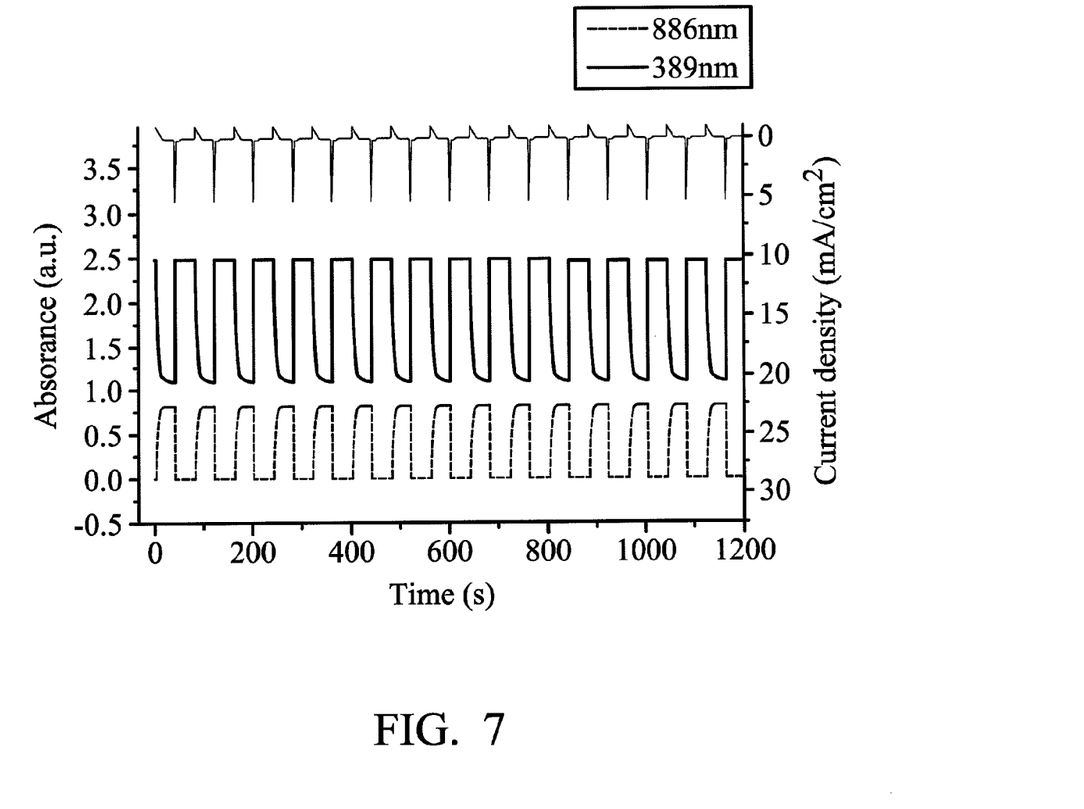
FIG. 7 shows a potential step absorptometry of the optoelectronic device employing the conjugated polymer (2) during a continuous cycling test by switching potentials between 0 V and 1.18V.

Moreover, the device employing the conjugated polymer (2) was potential stepped between its neutral state (0 V) and the second oxidation state (1.18 V) state with a cycle time of 80 s. The results are shown in FIG. 7. As shown in FIG. 7, the device employing the conjugated polymer (2) had a maximum absorption wavelength of 886 nm, an electrochromic switching time for oxidation of 8.6 s, and an electrochromic switching time for bleaching of 2.8 s.

Figure 8:
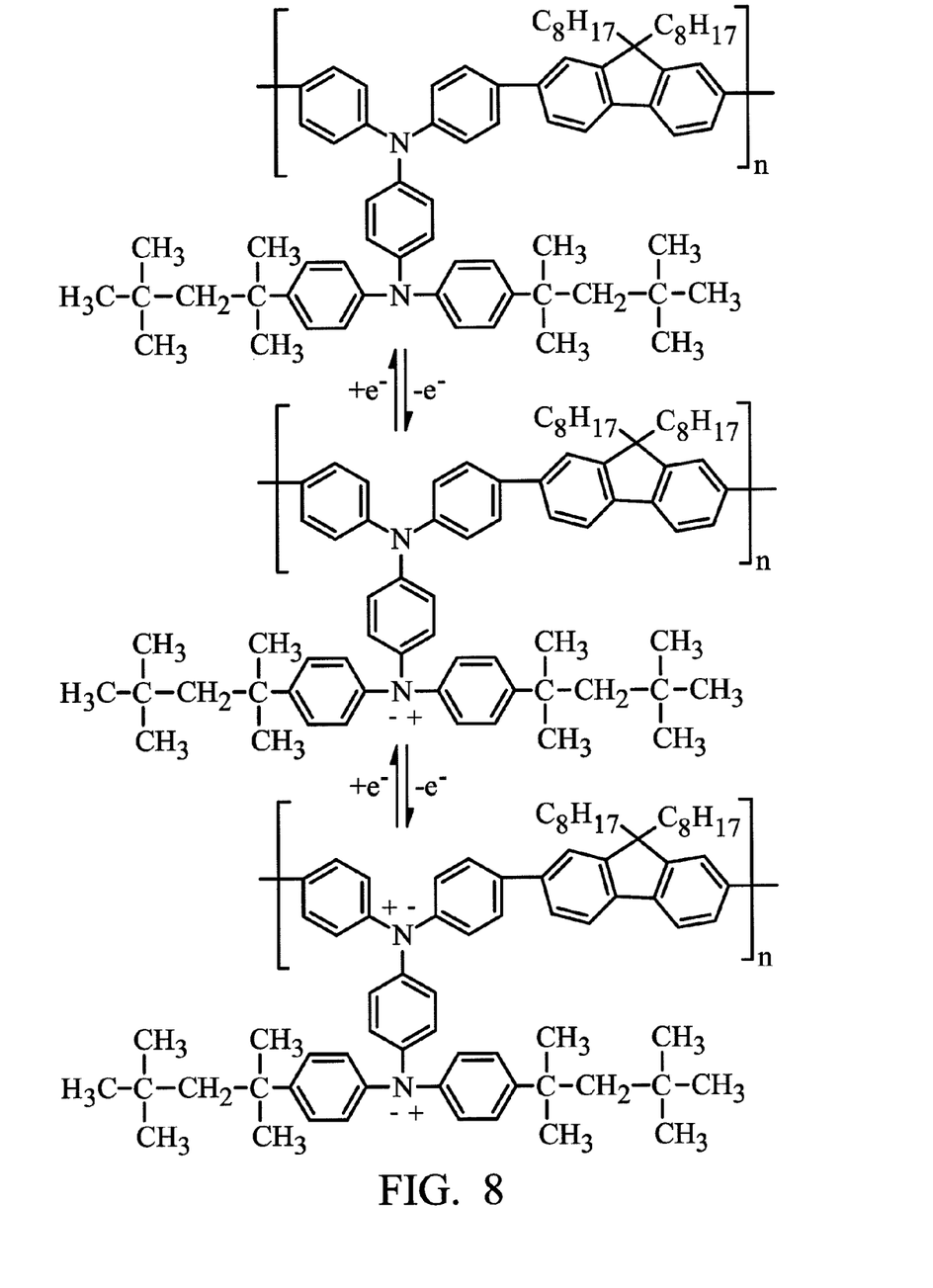
FIG. 8 shows a mechanism of the redox process of the conjugate polymer 2 switched between the neutral state, the radical cation state, and the dication state.

Accordingly, since the conjugated polymer of the invention has repeat units including triphenylamine moieties and fluorene moieties and the central nitrogen atom of the triphenylamine moiety has redox activities, (referring to FIG. 8), the optoelectronic device can be an organic light emitting diode (OLED), a polymer light emitting diode (PLED), a solar cell, a photoreceptor, a smart window, or an electrochromic device.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A conjugated polymer having Formula (I), of:

Formula (I)

wherein, R$^1$ is independently an octyl or dodecyl group; R$^2$ is independently an H or 1,1,3,3-tetramethylbutyl; and n is an integer larger than 1.

2. The conjugated polymer as claimed in claim 1, which has a structure represented by:

wherein, n is an integer larger than 1.

3. The conjugated polymer as claimed in claim 1, which has a structure represented by:

wherein, n is an integer larger than 1.

4. A method for preparing a conjugated polymer, comprising:

reacting a monomer having Formula (II) as follows:

with a compound having Formula (III), of:

in the presence of tetrakis(triphenylphosphine)palladium as a catalyst, wherein the conjugated polymer has Formula (I), of:

wherein, $R^1$ is independently an octyl or dodecyl group; $R^2$ is independently an H or 1,1,3,3-tetramethylbutyl; and n is an integer larger than 1.

5. An optoelectronic device, comprising:
a substrate; and
a film formed on the substrate, wherein the film comprises the conjugated polymer as claimed in claim 1.

6. The optoelectronic device as claimed in claim 5, wherein the optoelectronic device comprises an organic light emitting diode.

7. The optoelectronic device as claimed in claim 5, wherein the optoelectronic device comprises a solar cell.

8. The optoelectronic device as claimed in claim 5, wherein the optoelectronic device comprises a photoreceptor.

9. The optoelectronic device as claimed in claim 5, wherein the optoelectronic device comprises an electrochromic device.

10. The optoelectronic device as claimed in claim 5, wherein the optoelectronic device comprises a smart window.

* * * * *